United States Patent
Hwang

(10) Patent No.: US 8,502,553 B2
(45) Date of Patent: Aug. 6, 2013

(54) SEMICONDUCTOR PACKAGE TEST APPARATUS

(75) Inventor: Soon-Geol Hwang, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 394 days.

(21) Appl. No.: 13/007,721

(22) Filed: Jan. 17, 2011

(65) Prior Publication Data
US 2011/0215826 A1  Sep. 8, 2011

(30) Foreign Application Priority Data
Mar. 2, 2010 (KR) .................. 10-2010-0018645

(51) Int. Cl.
G01R 31/02 (2006.01)
G01R 31/26 (2006.01)

(52) U.S. Cl.
USPC ............ 324/762.02; 324/755.11; 324/757.04; 324/762.03; 324/762.06; 324/756.01; 324/750.13; 438/14; 438/15; 438/16; 438/17; 438/18

(58) Field of Classification Search
USPC ............ 324/755.11, 757.04, 762.02, 762.03, 324/762.06, 756.01, 750.13; 438/14–18
See application file for complete search history.

(56) References Cited

U.S. PATENT DOCUMENTS

| | | | | |
|---|---|---|---|---|
| 5,103,976 A | * | 4/1992 | Murphy | 206/719 |
| 5,131,535 A | * | 7/1992 | O'Connor et al. | 206/722 |
| 5,436,570 A | * | 7/1995 | Tan | 324/754.07 |
| 6,097,201 A | * | 8/2000 | Slocum | 324/750.05 |
| 6,242,933 B1 | * | 6/2001 | Yap | 324/756.02 |
| 6,396,294 B2 | * | 5/2002 | An et al. | 324/756.04 |
| 6,515,470 B2 | * | 2/2003 | Suzuki et al. | 324/750.03 |
| 6,856,128 B2 | * | 2/2005 | Ito et al. | 324/750.13 |
| 7,348,768 B2 | * | 3/2008 | Lee | 324/757.04 |
| 7,400,161 B2 | * | 7/2008 | Saito | 324/757.04 |
| 7,438,563 B2 | * | 10/2008 | Chung et al. | 439/91 |
| 7,578,046 B2 | * | 8/2009 | Vigil et al. | 29/564 |
| 7,583,076 B2 | * | 9/2009 | Kim et al. | 324/756.07 |
| 7,642,769 B2 | * | 1/2010 | Osakabe | 324/756.07 |
| 7,656,150 B2 | * | 2/2010 | Shim et al. | 324/756.07 |
| 7,955,892 B2 | * | 6/2011 | Shah | 438/106 |
| 8,258,804 B2 | * | 9/2012 | Shim et al. | 324/756.02 |
| 8,299,627 B2 | * | 10/2012 | Kim et al. | 257/777 |

(Continued)

FOREIGN PATENT DOCUMENTS

| | | |
|---|---|---|
| JP | 05004594 A | 1/1993 |
| KR | 20000012577 A | 7/2000 |
| KR | 20080006752 A | 1/2008 |

OTHER PUBLICATIONS

Humpston et al., "Low Cost Through Silicon Via Solution Suitable Compatible with Existing Assembly Infrastructure and Suitable for Single Die and Die Stacked Packages", EMAP 2008, p. 61-64.*

Primary Examiner — Arleen M Vazquez
Assistant Examiner — Lamarr Brown
(74) Attorney, Agent, or Firm — Harness, Dickey & Pierce

(57) ABSTRACT

A semiconductor package test apparatus having a test head and a test handler is provided. The semiconductor package test apparatus may include an insert in which a plurality of semiconductor packages are stacked and received in an offset fashion. Further, the semiconductor package test apparatus may include a plurality of sockets located adjacent to the insert and each of the inserts may have a plurality of socket pins. The sockets have different surface levels and are aligned with the semiconductor packages.

20 Claims, 16 Drawing Sheets

(56) References Cited

U.S. PATENT DOCUMENTS

| | | | |
|---|---|---|---|
| 2002/0182759 A1* | 12/2002 | Yamagata et al. | 438/11 |
| 2004/0143411 A1* | 7/2004 | Wu | 702/117 |
| 2005/0012498 A1* | 1/2005 | Lee et al. | 324/158.1 |
| 2006/0121757 A1* | 6/2006 | Chung et al. | 439/91 |
| 2006/0261457 A1* | 11/2006 | Rancuret et al. | 257/679 |
| 2006/0290369 A1* | 12/2006 | Yamashita et al. | 324/765 |
| 2007/0040570 A1* | 2/2007 | Gopal et al. | 324/765 |
| 2007/0069752 A1* | 3/2007 | Ito et al. | 324/765 |
| 2007/0167038 A1* | 7/2007 | Goodman | 439/70 |
| 2007/0182437 A1* | 8/2007 | Shim et al. | 324/765 |
| 2007/0236690 A1* | 10/2007 | Kimba et al. | 356/237.4 |
| 2007/0296419 A1* | 12/2007 | Aizawa et al. | 324/537 |
| 2008/0038848 A1* | 2/2008 | Cheon | 438/15 |
| 2008/0220545 A1* | 9/2008 | Pelley | 438/14 |
| 2008/0233663 A1* | 9/2008 | Norbeck et al. | 438/14 |
| 2008/0238470 A1* | 10/2008 | Na et al. | 324/765 |
| 2008/0252313 A1* | 10/2008 | Hopkins et al. | 324/754 |
| 2008/0252314 A1* | 10/2008 | Hopkins et al. | 324/754 |
| 2008/0252317 A1* | 10/2008 | Hopkins et al. | 324/755 |
| 2008/0258306 A1* | 10/2008 | Chang et al. | 257/762 |
| 2008/0293167 A1* | 11/2008 | Wada et al. | 438/15 |
| 2009/0035881 A1* | 2/2009 | Yamashita et al. | 438/11 |
| 2009/0189267 A1* | 7/2009 | Kim et al. | 257/686 |
| 2010/0019366 A1* | 1/2010 | Rancuret et al. | 257/678 |
| 2010/0035381 A1* | 2/2010 | Yoshimura et al. | 438/109 |
| 2010/0295572 A1* | 11/2010 | Ryu | 324/765 |
| 2011/0121294 A1* | 5/2011 | Koyama et al. | 257/48 |
| 2012/0058650 A1* | 3/2012 | Cha et al. | 439/60 |
| 2012/0061853 A1* | 3/2012 | Su et al. | 257/778 |
| 2012/0062262 A1* | 3/2012 | Lee | 324/757.04 |
| 2012/0248441 A1* | 10/2012 | Trobough et al. | 257/48 |

* cited by examiner

SEMICONDUCTOR PACKAGE TEST APPARATUS

CROSS-REFERENCE TO RELATED APPLICATION

This application claims priority under 35 U.S.C. §119 to Korean Patent Application No. 10-2010-0018645 filed on Mar. 2, 2010, in the Korean Intellectual Property Office (KIPO), the disclosure of which is hereby incorporated by reference in its entirety.

BACKGROUND

1. Field

Example embodiments of the inventive concepts relate to a semiconductor package test apparatus for simultaneously testing manufactured semiconductor packages.

2. Description of Related Art

Recent development of semiconductor package manufacturing technology has led to mass production of semiconductor packages. Thus, a need has arisen for development of efficient testers for accurately testing a number of semiconductor packages within a short time.

Known inserts are each configured to insert one package in one pocket. The size of the package is standardized, and thus there is a limitation to the number of packages to be tested per unit time. The number of packages to be tested at the same time is reduced in proportion to their areas. Furthermore, a test time is delayed, and thus entire test efficiency is lowered.

SUMMARY

Example embodiments of the inventive concepts provide a semiconductor package test apparatus capable of simultaneously testing semiconductor packages without a limitation to the number of semiconductor packages to be tested per unit time despite an increase in area of the semiconductor package.

Other example embodiments of the inventive concepts provide a semiconductor test handler capable of simultaneously testing semiconductor packages without a decrease in the number of semiconductor packages.

Still other example embodiments of the inventive concepts provide a semiconductor test head capable of simultaneously testing semiconductor packages without a decrease in the number of semiconductor packages.

In example embodiments of the inventive concepts, a semiconductor package test apparatus may include an insert and a plurality of sockets adjacent to the insert. In example embodiments, the insert may be configured to support a plurality of semiconductor packages in an offset fashion. In example embodiments, the each socket of the plurality of sockets may have a plurality of socket pins, wherein the sockets are configured for alignment with the semiconductor packages and the sockets have different surface levels.

In example embodiments of the inventive concepts, a semiconductor test handler may include a test tray configured to support a plurality of inserts, and a loader adjacent to the test tray. In example embodiments, each insert may be configured to support a plurality of semiconductor packages stacked therein in an offset fashion.

In accordance with example embodiments, a semiconductor test head may include a signal input/output unit and a plurality of sockets electrically connected to the signal input/output unit, wherein the sockets have different surface levels.

In accordance with an example embodiment of the inventive concepts, a semiconductor package test apparatus may include an insert, a first socket, and a second socket. The insert may be configured to support a second semiconductor package and a first semiconductor package, the insert may be further configured to support the second semiconductor package and the first semiconductor package such that at least a portion of the second semiconductor is exposed by the first semiconductor package. In this example embodiment the first socket may include a first plurality of socket pins configured to contact the first semiconductor package and the first plurality of socket pins may include first ends at a first surface level. In this example embodiment the second socket may include a second plurality of socket pins configured to contact the second semiconductor package and the second plurality of socket pins may include second ends at a second surface level which is different from the first surface level.

In accordance with an example embodiment of the inventive concepts, a semiconductor test handler may include a test tray having at least one insert and a loader located adjacent to the test tray. In this example embodiment the that at least one insert may be configured to support a second semiconductor package and a first semiconductor package and the at least one insert may be further configured to support the second semiconductor package and the first semiconductor package such that at least a portion of the second semiconductor is exposed by the first semiconductor package.

In accordance with an example embodiment of the inventive concepts, a semiconductor test head may include a signal input/output unit and a plurality of sockets electrically connected to the signal input/output unit, wherein the sockets have different surface levels.

In accordance with an aspect of the inventive concepts, a semiconductor package test apparatus includes an insert in which a plurality of semiconductor packages are stacked and received in an offset fashion, and a plurality of sockets located adjacent to the insert and each having a plurality of socket pins. The sockets have different surface levels, and are aligned with the semiconductor packages.

In example embodiments of the inventive concepts, the insert may include a plate having at least one opening, a front guide foliated on one end of the plate, and a rear guide facing the front guide. Among the semiconductor packages, a lower semiconductor package may be in contact with the plate and the rear guide, and an upper semiconductor package disposed on the lower semiconductor package may be in contact with the front guide. The sockets may be aligned in the opening.

In example embodiments of the inventive concepts, the rear guide may be in contact with the upper semiconductor package.

In example embodiments of the inventive concepts, the lower and upper semiconductor packages may be equal in size to each other.

In example embodiments of the inventive concepts, the insert may further include latches capable of coming into contact with the upper semiconductor package. The lower and upper semiconductor packages may be received between the latches and the plate.

In example embodiments of the inventive concepts, one or more of the semiconductor packages may be stacked between the lower and upper semiconductor packages in an offset fashion.

In example embodiments of the inventive concepts, each semiconductor package may include pads, which are formed of a conductive material along one edge of one surface thereof and electrically connected with the socket pins.

In example embodiments of the inventive concepts, the sockets may include a lower socket aligned with the lower semiconductor package of the semiconductor packages and having a plurality of lower socket pins, and an upper socket aligned with the upper semiconductor package of the semiconductor packages and having a plurality of upper socket pins. The upper socket pins may have a surface level relatively higher than that of the lower socket pins.

In example embodiments of the inventive concepts, the upper socket pins may be longer than the lower socket pins.

In example embodiments of the inventive concepts, the lower socket may include a lower support contacting the lower socket pins. The upper socket may include an upper support contacting the upper socket pins. The upper support may protrude relative to the lower support.

In example embodiments of the inventive concepts, the semiconductor package test apparatus may further include a signal input/output unit adjacent to the sockets. The lower and upper socket pins may be connected to the signal input/output unit.

In example embodiments of the inventive concepts, the lower socket pins may be electrically isolated from the upper socket pins.

In accordance with another aspect of the inventive concepts, a semiconductor test handler includes a test tray having a plurality of inserts, and a loader located adjacent to the test tray. Each insert has a plurality of semiconductor packages stacked therein in an offset fashion.

In example embodiments of the inventive concepts, each insert may include a plate having at least one opening, a front guide formed on one end of the plate, and a rear guide facing the front guide. Among the semiconductor packages, a lower semiconductor package may be in contact with the plate and the rear guide, and an upper semiconductor package disposed on the lower semiconductor package may be in contact with the front guide.

In other example embodiments of the inventive concepts, the rear guide may be in contact with the upper semiconductor package.

In other example embodiments of the inventive concepts, each insert may further include latches capable of coming into contact with the upper semiconductor package, and the lower and upper semiconductor packages may be received between the latches and the plate.

In accordance with still another aspect of the inventive concepts, a semiconductor test head includes a signal input/output unit, and a plurality of sockets electrically connected to the signal input/output unit. The sockets may have different surface levels.

In example embodiments of the inventive concepts, the sockets may include a lower socket having a plurality of lower socket pins, and an upper socket having a plurality of upper socket pins. The upper socket pins may have a surface level relatively higher than that of the lower socket pins. The lower and upper socket pins may be electrically connected to the signal input/output unit.

In other example embodiments of the inventive concepts, the lower socket may include a lower support in which the lower socket pins are formed at an interval of a first pitch. The upper socket may include an upper support in which the upper socket pins are formed at an interval of a second pitch. The lower and upper socket pins may have one selected from the group consisting of an arrangement in which the first pitch is equal to the second pitch, and a line connecting two central ones selected from the lower socket pins is perpendicular to a line connecting one selected from the two central lower socket pins with the upper socket pin nearest the selected central lower socket pin, an arrangement in which the first pitch is equal to the second pitch, and when one of two central ones of the upper socket pins is selected at a distance nearest two central ones of the lower socket pins, distances between the selected upper socket pin and the two adjacent lower socket pins are equal to each other, an arrangement in which the first pitch is different from the second pitch, and a combination thereof.

In other example embodiments of the inventive concepts, the upper support may protrude relative to the lower support.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EXAMPLE EMBODIMENTS

Figure 1:
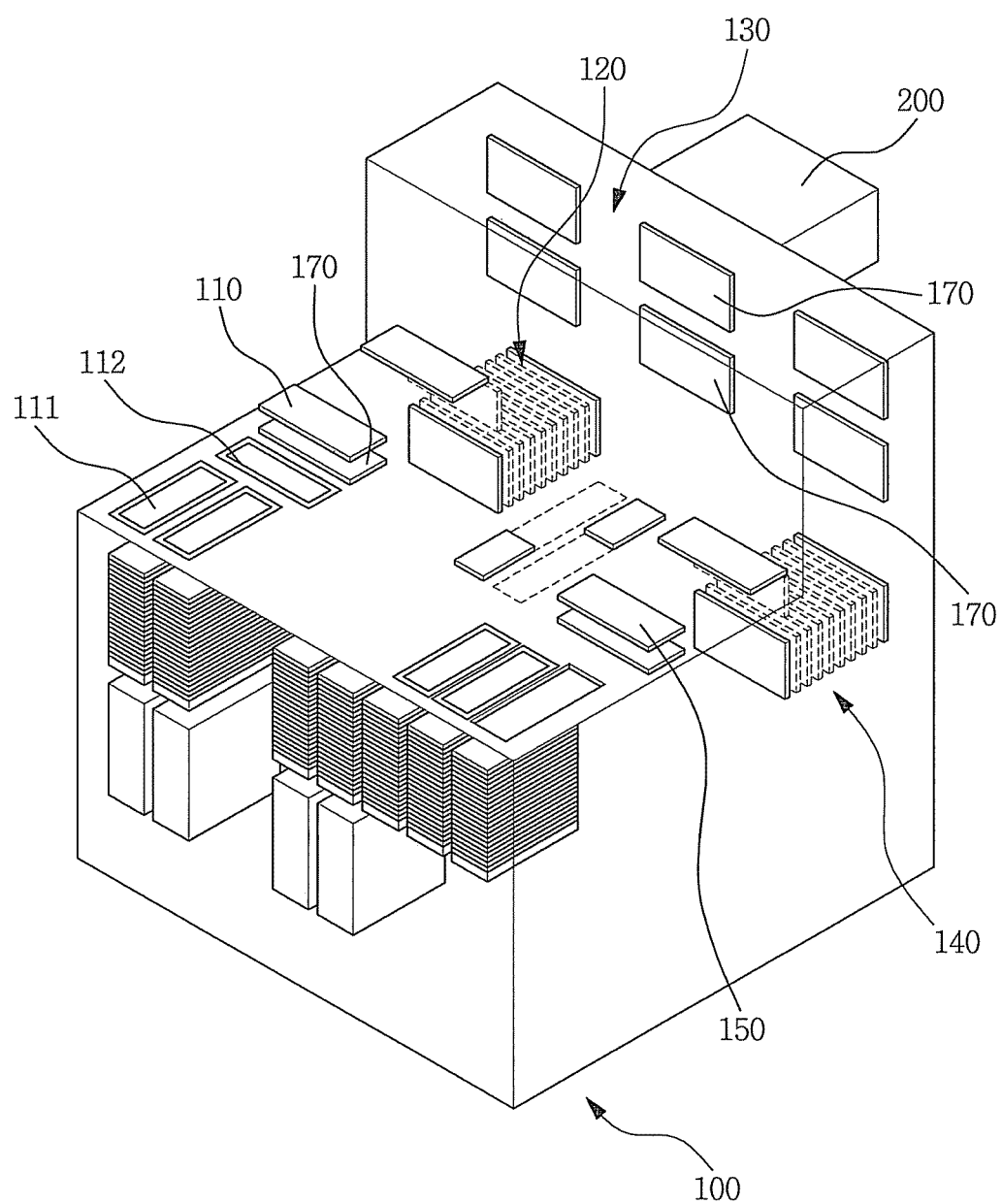
FIG. 1 is a perspective view of a semiconductor package test apparatus according to an example embodiment of the inventive concepts.

Various example embodiments will now be described more fully with reference to the accompanying drawings in which some example embodiments are shown. The inventive concepts may, however, be embodied in different fauns and should not be construed as limited to the example embodiments set forth herein. Rather, the example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a semiconductor package test apparatus according to an example embodiment of the inventive concepts. Referring to FIG. 1, a semiconductor package test apparatus generally includes a test handler 100 and a test head 200.

The test handler 100 serves to feed and align semiconductor packages to allow the semiconductor packages to be automatically tested, sort the semiconductor packages when tested, and put the semiconductor packages into a transfer and storage means such as a tray. The test handler 100 includes a loader 110, a soak chamber 120, a test chamber 130, a desoak chamber 140, an unloader 150, and a test tray 170.

The loader 110 aligns semiconductor packages in a customer tray using an align block 112, and then loads the semiconductor packages onto the test tray 170. The loader 110 stacks the semiconductor packages in an offset fashion when loading the semiconductor packages onto the test tray 170.

The soak chamber 120 pre-heats or pre-cools the semiconductor packages loaded on the test tray 170 by the loader 110.

Then, the test tray 170 is accommodated in the test chamber 130 for a performance test of the semiconductor packages, and then the semiconductor packages are tested. The test head 200 is located at the rear of the test chamber 130, and tests the semiconductor packages on the test tray 170 in the test chamber 130. To test the semiconductor packages, sockets of the test head 200 are electrically connected with pads of each semiconductor package.

The test tray 170, on which the semiconductor packages tested in the test chamber 130 are loaded, is recovered to room temperature in the desoak chamber 140. On the basis of the test results, the unloader 150 sorts and loads the semiconductor packages on the test tray 170 according to a grade.

Figure 2A:
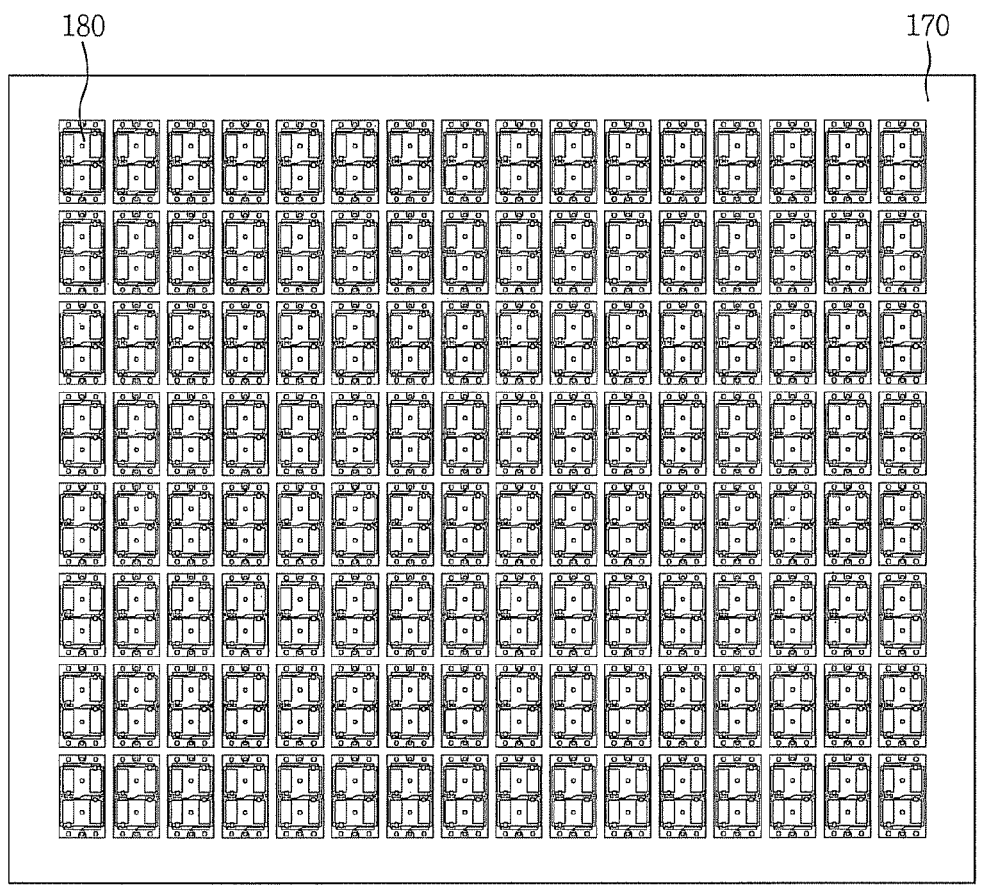
FIG. 2A is a plan view of a test tray and inserts according to an example embodiment of the inventive concepts.
Figure 2B:
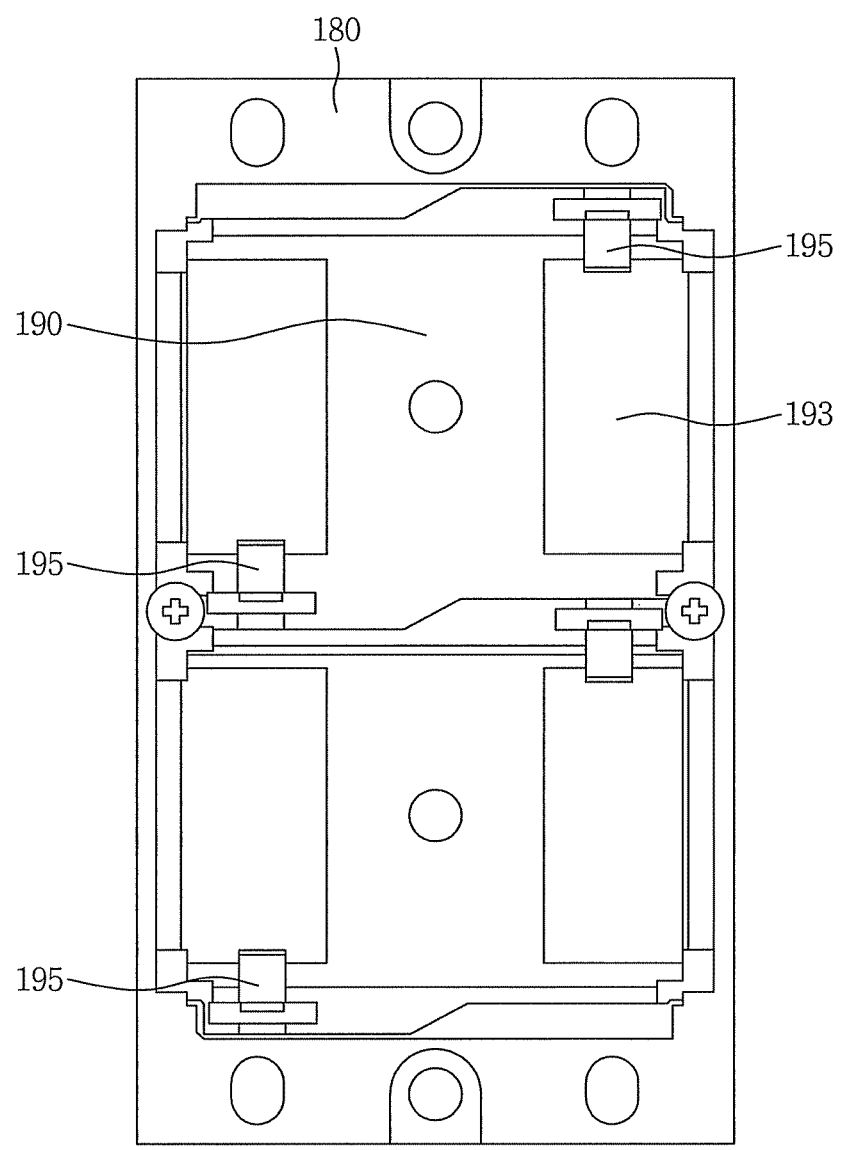
FIG. 2B is an enlarged plan view of one of the inserts of FIG. 2A.

FIG. 2A is a plan view of a test tray 170, and FIG. 2B is a plan view of one insert 180 installed on a test tray.

The test tray 170 includes inserts 180 in which the semiconductor packages to be tested are stacked and received in an offset fashion. In FIG. 2A, the test tray 170 having the inserts 180 of an 8×16 array is represented. The test tray 170 is transferred to a corresponding part of the test handler 100 by a transfer device (not shown) of the test handler 100, and comes into contact with the test head 200 in the test chamber 130, so that the semiconductor packages loaded on the test tray 170 can be simultaneously tested.

Further, each insert 180 may include, but is not essentially limited to, package holders (not shown) having a 1×2 or 2×2 array structure. The semiconductor packages may be directly stacked and received in each package holder in an offset fashion. In example embodiments, each package holder of the insert 180 may be equipped with a pocket 190, which can fixedly support the semiconductor packages. The semiconductor packages may be stacked in each pocket 190 in an offset fashion. Each pocket 190 is provided with openings 193 in the bottom thereof, each of which provides a space where the socket pins of the test head 200 can be electrically connected with the pads of the semiconductor package.

Meanwhile, the pocket 190 or the insert 180 may be provided with latches 195 supporting the semiconductor packages. The latches 195 fix positions of the semiconductor packages stacked in an offset or stepwise fashion when the semiconductor packages can be tested in connection with the socket pins formed on the test head 200, which will be described below.

Figure 3A:
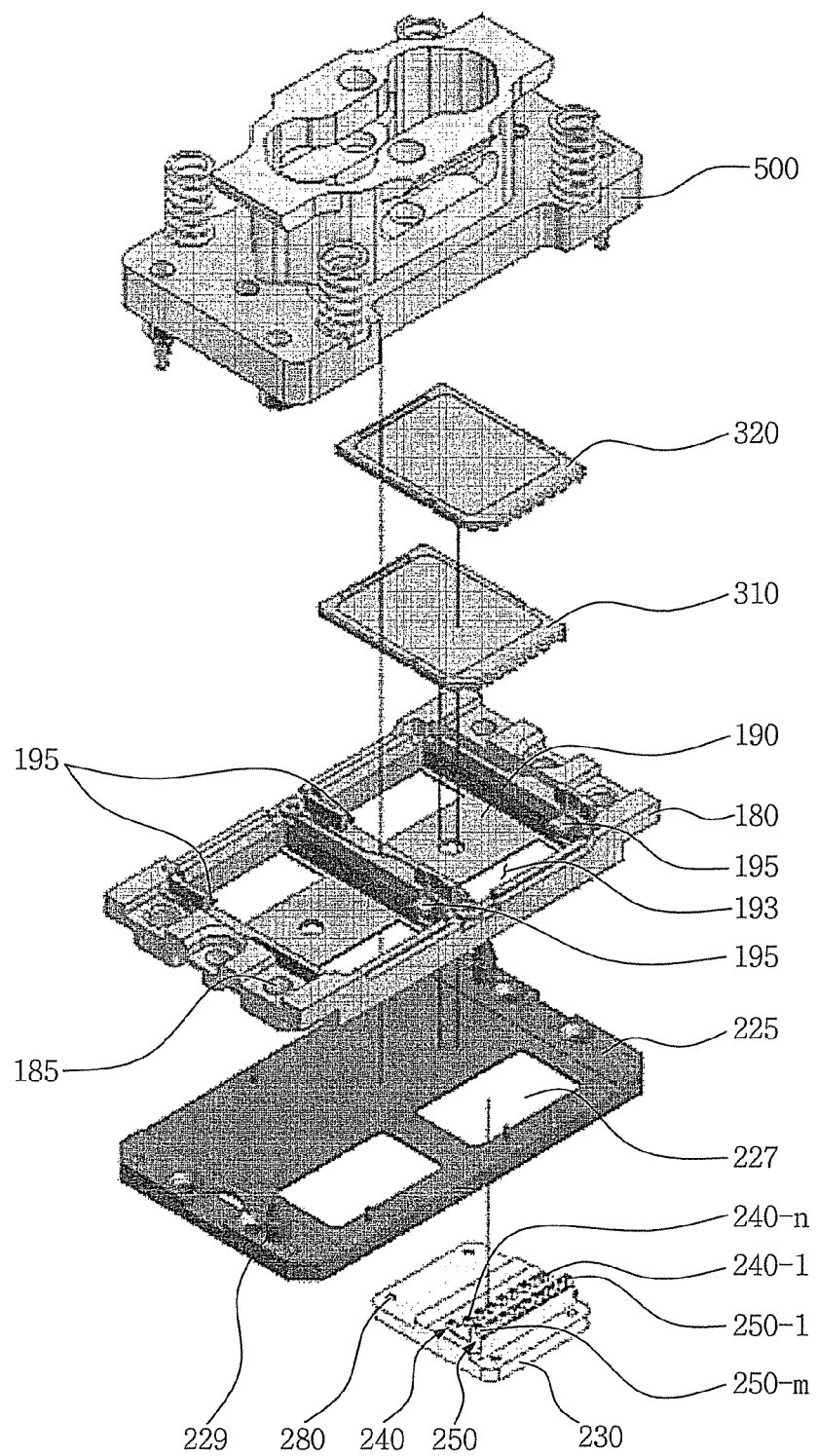
FIG. 3A is a disassembled perspective view illustrating the state in which a test tray is disassembled from a test head.
Figure 3B:
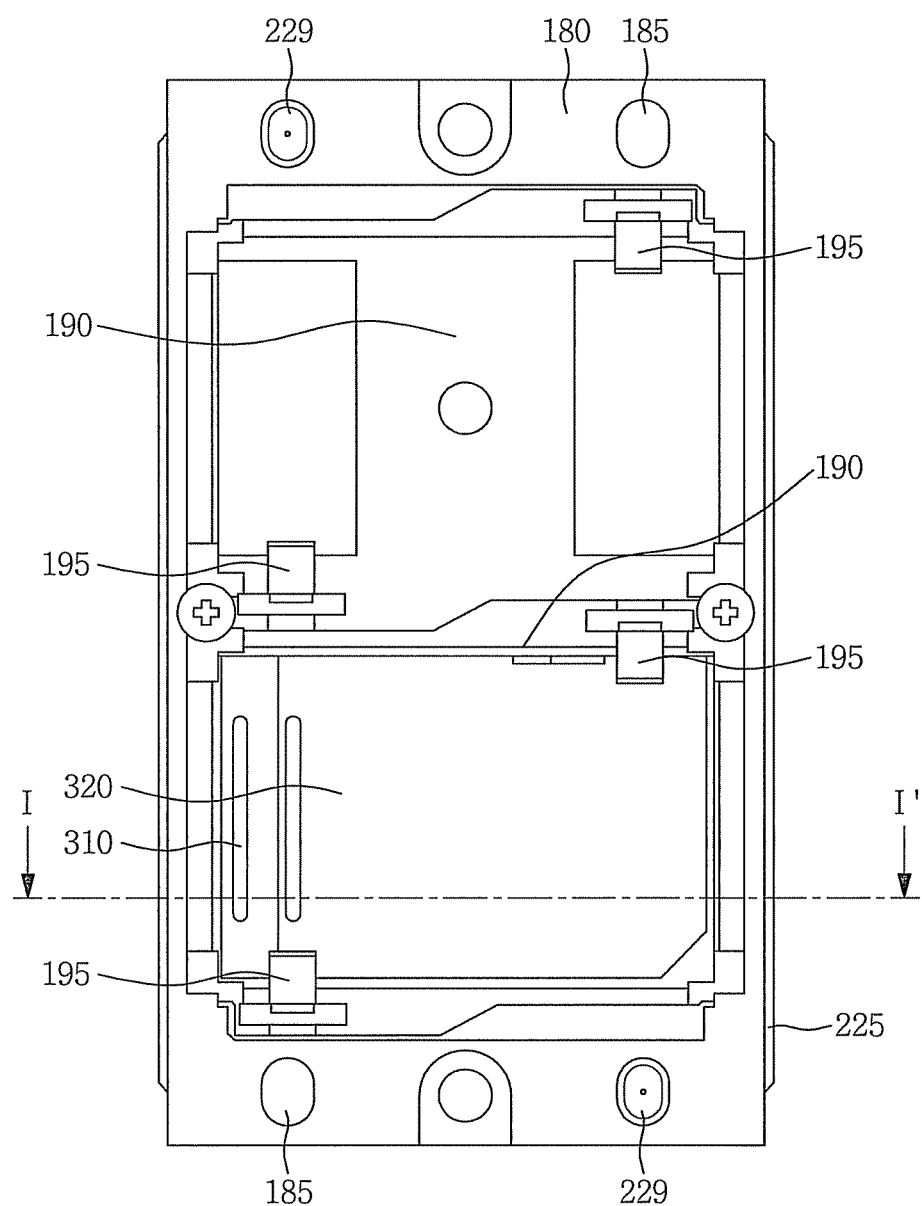
FIG. 3B is a plan view illustrating the state in which a test tray is assembled with a test head.

FIG. 3A is a disassembled perspective view illustrating the state in which a test tray is disassembled from a test head in the test chamber, and FIG. 3B is a plan view illustrating the state in which a test tray is assembled with a test head without a push unit.

As can be seen from FIG. 3A, a plurality of sockets 240 and 250 are formed on one main socket support 230. The main socket support 230 corresponds to one package holder or pocket 190 formed on the insert 180. Further, the main socket support 230 supports the sockets 240 and 250 on top thereof, and is supportably coupled to a socket guide 225 through contact pins 280. Meanwhile, socket pins 240-1 to 240-$n$ and 250-1 to 250-$m$ are electrically connected with signal input/output units, which will be described below, through an internal wiring (not shown).

The sockets 240 and 250 include a plurality of socket pins 240-1 to 240-$n$ and 250-1 to 250-$m$. The sockets 240 and 250 are disposed close to the insert 180. The sockets 240 and 250 have different surface levels. Here, the surface level refers to a height from the bottom of the main socket support 230 to the socket pins installed on each socket. In other words, the surface level may indicate a height from the bottom of the main socket support 230 to each socket.

FIG. 3A illustrates the state in which the two sockets 240 and 250 having different surface levels are formed on the main socket support 230. In FIG. 3A, the socket having a relatively low surface level functions as the lower socket 240, and the socket having a relatively high surface level functions as the upper socket 250. The lower socket 240 has a plurality of lower socket pins 240-1 to 240-$n$. n is number of lower socket pins. Similarly, the upper socket 250 has a plurality of upper socket pins 250-1 to 250-$m$. m is number of upper socket pins. The surface level of the lower socket pins 240-1 to 240-$n$ is lower than that of the upper socket pins 250-1 to 250-$m$.

The socket guide 225 constitutes a part of a hi-fix board (not shown) formed on the test head 200. The socket guide 225 is provided therein with through-holes 227. When the semiconductor package is tested in the test chamber 130, the lower and upper socket pins 240-1 to 240-$n$ and 250-1 to 250-$m$ are exposed toward the insert 180 through each through-hole 227. Further, the socket guide 225 is provided with reinforcement ribs 229 on an edge thereof. A position at which the socket guide 225 is coupled with the insert 180 is fixed through the reinforcement ribs 229. The insert 180 has reinforcement rib holders 185 corresponding to the reinforcement ribs 229, and thus can be smoothly engaged with the socket guide 225.

Two or more semiconductor packages may be stacked and received in the insert 180 in an offset fashion. The two or more semiconductor packages may be directly received in the insert 180 and the two or more semiconductor packages may be stacked and received in the pocket 190 of the package holder in an offset fashion as illustrated in FIG. 3A. FIG. 3A illustrates a structure in which two semiconductor packages 310 (an example of a first semiconductor package) and 320 (an example of a second semiconductor package) are stacked and received in an offset or stepwise fashion. The lower semiconductor package 310 stacked below may be aligned corresponding to the lower socket 240 (an example of a first socket). The pads formed on the lower semiconductor package 310 are electrically connected with the lower socket pins 240-1 to 240-$n$ (an example of a first plurality of socket pins) formed on the lower socket 240. Similarly, the upper semiconductor package 320 stacked and received on the lower semiconductor package 310 in a stepwise fashion is aligned corresponding to the upper socket 250 (an example of a second socket). The pads formed on the upper semiconductor package 320 may be electrically connected with the upper socket pins 250-1 to 250-$m$ (an example of a second plurality of socket pins) formed on the upper socket 250.

In example embodiments, the upper semiconductor package 320 may be fixed by the latches 195 installed on the left or right side of the insert 180 or the pocket 190. The pads of the upper semiconductor package 320 may be stably and electrically connected with the upper socket pins 250-1 to 250-$m$ of the upper socket 250 by the latches 195.

When the test tray 170 is transferred to a predetermined position in the test chamber 130, the test head 200 moves into the test chamber 130, and comes into contact with the test tray 170. The test head 200 and the test tray 170, particularly the socket pins 240-1 to 240-$n$ and 250-1 to 250-$m$ of the test head 200 and the pads of the semiconductor packages 310 and 320 stacked and received in the insert 180 of the test tray 170 in an offset fashion, are brought into contact with each other with higher precision by the push unit 500 installed in the test chamber 130. Here, a pusher (not shown) of the push unit 500 is adapted to apply proper pressure to the top of the upper semiconductor package 320. The pusher may be formed of an elastic member. Sine this pressure is transmitted to the lower semiconductor package 310 as well, the pads of the semiconductor packages are prevented from being disconnected from the socket pins.

FIG. 3B is a plan view illustrating the state in which the test tray 170 and the test head 200 are coupled in the test chamber 130 in accordance with an example embodiment of the inventive concepts. The two package holders include respective pockets 190. In FIG. 3B, the lower and upper semiconductor packages 310 and 320 are sequentially stacked and received in one of the pockets in an offset fashion, and fixed by the latches 195, while no semiconductor packages are received in the other pocket 190. The reinforcement rib holder 185 of the insert 180 is coupled to the reinforcement ribs 229 of the socket guide 225, and thus fixes positions of the insert 180 and the socket guide 225.

Figure 4:
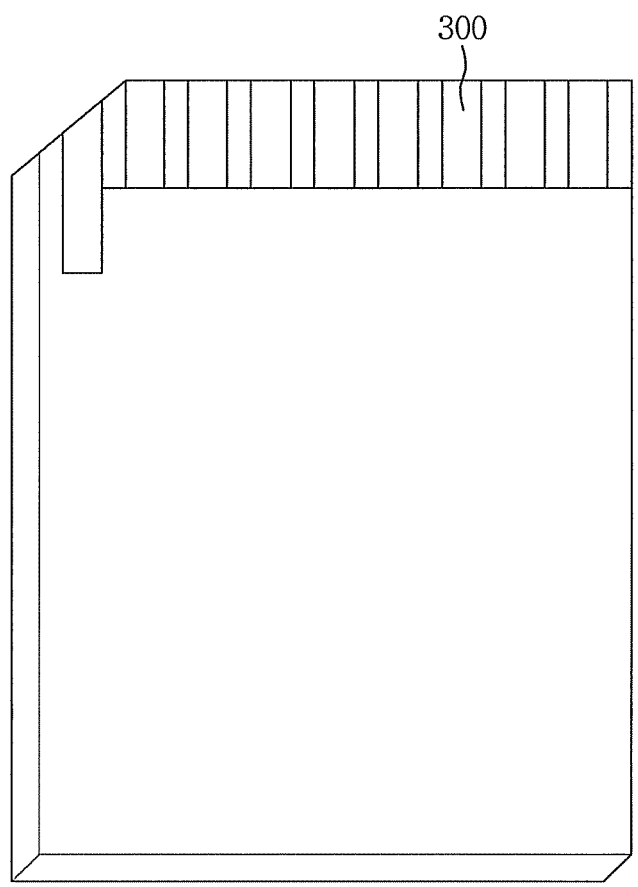
FIG. 4 is a plan view of a semiconductor package of a one-row pad package type according to an example embodiment of the inventive concepts.

For convenience of understanding, FIG. 4 illustrates a one-row pad package type package tested by a semiconductor package test apparatus according to an example embodiment of the inventive concepts. Here, the semiconductor package test apparatus according to an example embodiment of the inventive concepts may be applied to the one-row pad package type package illustrated in FIG. 4, as well as the semiconductor packages that can be stacked and received in the insert 180 in an offset fashion. The one-row pad package type package includes pads 300, each of which is formed of a conductive material, on one side of an upper or lower surface thereof. The pads 300 are electrically connected with the socket pins formed on the test head, which will be described below.

Figure 5A:
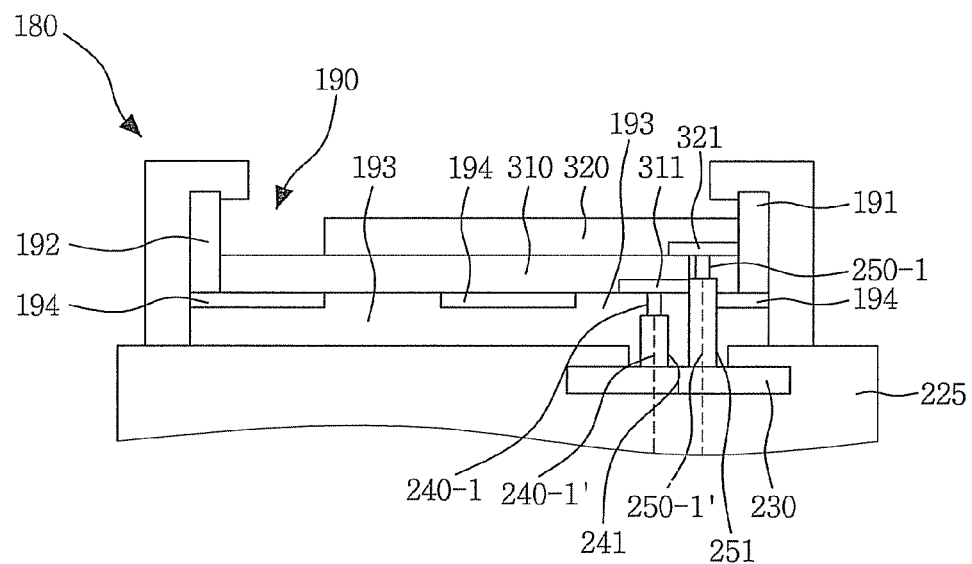
FIGS. 5A through 5C are schematic cross-sectional views taken along line I-I' of FIG. 3B.
Figure 5B:
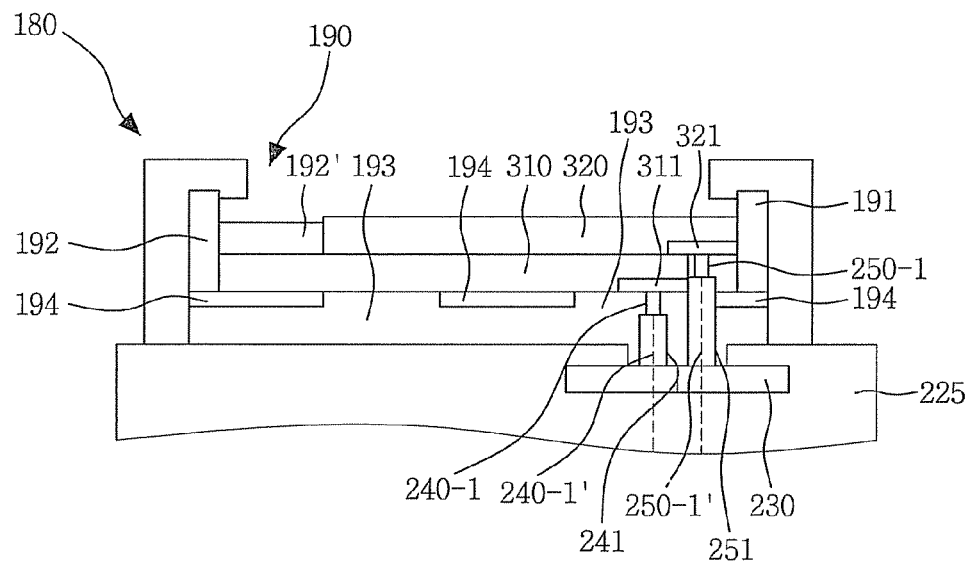
Figure 5C:
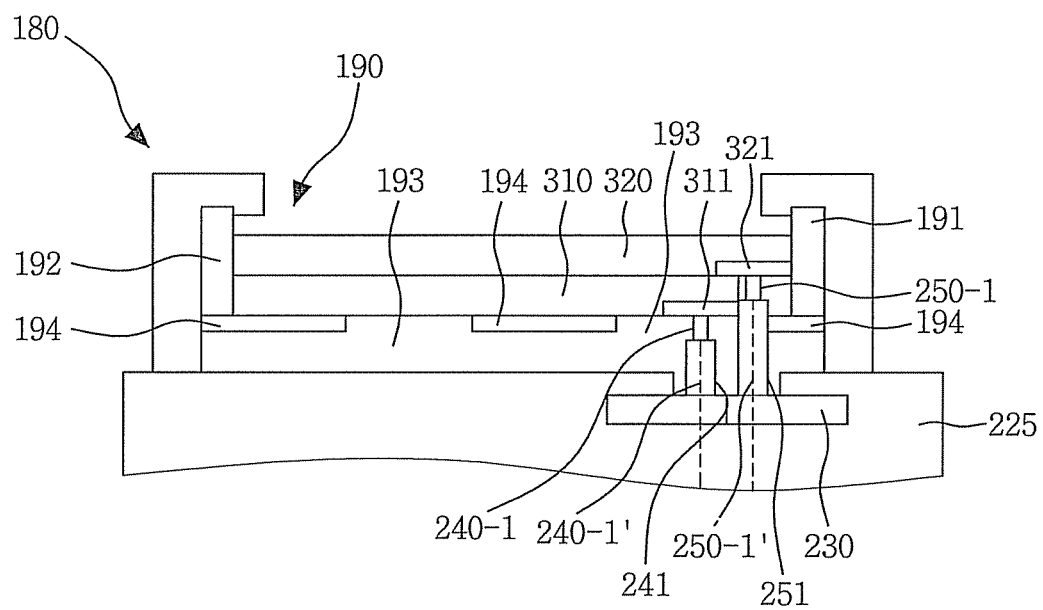

FIGS. 5A through 5C are schematic cross-sectional views taken along line I-I' of FIG. 3B. The pocket 190 is formed in the package holder of the insert 180. The package holder of the insert 180 includes a plate 194 that has openings 193 and forms the bottom of the pocket 190, a front guide 191 formed on one end of the plate 194, and a rear guide 192 formed opposite the front guide 191. The pocket 190 is fixed by the insert 180, and the semiconductor packages 310 and 320 are fixed by the pocket 190. The lower semiconductor package 310 of the semiconductor packages is fixed in position by contact with the plate 194 and the rear guide 192. Here, the lower semiconductor package 310 may be fixed in position by contact with an upper support 251.

The upper semiconductor package 320, which is stacked on the lower semiconductor package 310 and received with an offset from the lower semiconductor package 310, is fixed in position by contact with the front guide 191. Although not illustrated in the figures, the upper semiconductor package 320 may be prevented from being pushed toward the rear guide 192 by the latches 195 formed on the left or right side of the pocket.

The lower and upper sockets 240 and 250 are formed on the main socket support 230. The lower socket 240 includes a lower support 241 and lower socket pins 240-1 to 240-*n* formed on the lower support 241. The upper socket 250 includes an upper support 251 and upper socket pins 250-1 to 250-*m* formed on the upper support 251. A surface level of the upper socket 250 is higher than that of the lower socket 240. These sockets 240 and 250 are aligned in the corresponding opening 193. The sockets 240 and 250 are electrically connected with the respective semiconductor packages 310 and 320 through the opening 193. In detail, the lower socket pins 240-1 to 240-*n* are electrically connected with pads 311 formed on one end of the lower surface of the lower semiconductor package 310, and the upper socket pins 250-1 to 250-*m* are electrically connected with pads 321 formed on one end of the lower surface of the upper semiconductor package 320.

To this end, a difference between the surface levels of the lower and upper sockets 240 and 250 is required. The surface level difference causes the lower and upper sockets 240 and 250 to be formed in a step form such that the pads 311 of the lower semiconductor package 310 are electrically connected with the lower socket pins 240-1 to 240-*n* and the pads 321 of the upper semiconductor package 320 are electrically connected with the upper socket pins 250-1 to 250-*m*.

In example embodiments, the upper socket pins 250-1 to 250-*m* are electrically connected with a wiring 250-1' to 250-*n*' formed in the upper support 251, while the lower socket pins 240-1 to 240-*n* are electrically connected with a wiring 240-1' to 240-*n*' formed in the lower support 241. These wirings 240-1' to 240-*n*' and 250-1' to 250-*n*' are electrically independent of and isolated from each other. In example embodiments, the wirings 240-1' to 240-*n*' and 250-1' to 250-*n*' may be electrically connected with an input/output unit in the head body via the inside of the main socket support 230.

As can be seen from FIGS. 5B and 5C, in another example embodiment of the inventive concepts, the rear guide 192 may come into contact with the upper semiconductor package 320. In FIG. 5B, a protrusion 192' is formed on a part of the rear guide 192, and the protrusion 192' of the rear guide 192 is in contact with the upper semiconductor package 320. In example embodiments the protrusion 192' may be a rigid member or an elastic (spring) member. In FIG. 5C, the upper semiconductor package 320 is larger than the lower semiconductor package 310, and in contact with the rear guide 192.

Figure 6:
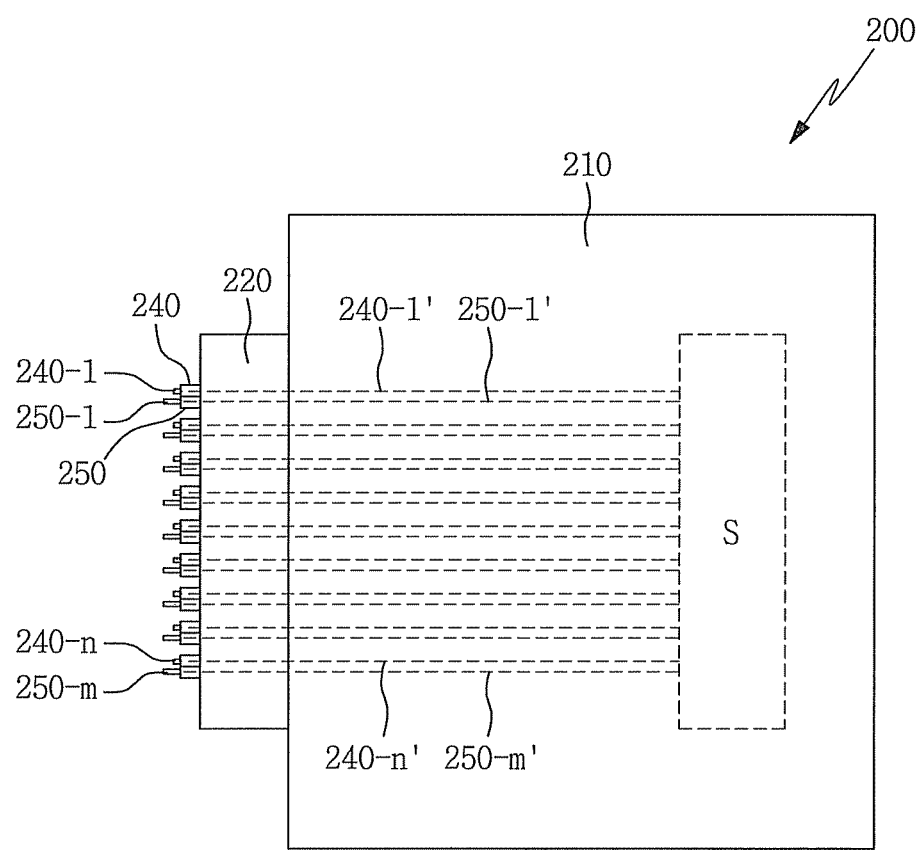
FIG. 6 is a front view of a test head according to an example embodiment of the inventive concepts.

Referring to FIG. 6, the test head 200 constituting the semiconductor package test apparatus according to an example embodiment of the inventive concepts includes a head body 210, a hi-fix board 220, sockets 240 and 250, wirings 240-1' to 240-*n*' and 250-1' to 250-*n*', and a signal input/output unit S. According to an example embodiment of the inventive concepts, the wirings 240-1' to 240-*n*' and 250-1' to 250-*n*' and the signal input/output unit S are disposed inside the test head, and thus are indicated by dotted lines. The signal input/output unit S is electrically connected with the socket pins 240-1 to 240-*n* and 250-1 to 250-*m*. The signal input/output unit S exchanges electrical signals with an external main computer (not shown). Further, the signal input/output unit S exchanges electrical signals with the socket pins 240-1 to 240-*n* and 250-1 to 250-*m*. To this end, the wirings 240-1' to 240-*n*' and 250-1' to 250-*n*' may be formed to electrically connect the signal input/output unit S with the socket pins 240-1 to 240-*n* and 250-1 to 250-*m*. The wirings 240-1' to 240-*n*' and 250-1' to 250-*n*' are electrically isolated from each other, and independently transmit the measurement signals of the socket pins 240-1 to 240-*n* and 250-1 to 250-*m* to the signal input/output unit S or independently transmit the signals of the main computer to the socket pins 240-1 to 240-*n* and 250-1 to 250-*m*. In example embodiments, the signal input/output unit S may be aimed inside the head body 210, as illustrated in FIG. 6. Alternatively, the signal input/output unit S may be separately formed outside the head body 210.

The hi-fix board 220 includes the plurality of sockets 240 and 250, which can be electrically connected with the plurality of semiconductor packages fed from the test handler 100 by the test tray 170. The sockets 240 and 250 are formed on the main socket support (not shown). Here, the sockets 240 and 250 have different surface levels.

Figure 7A:
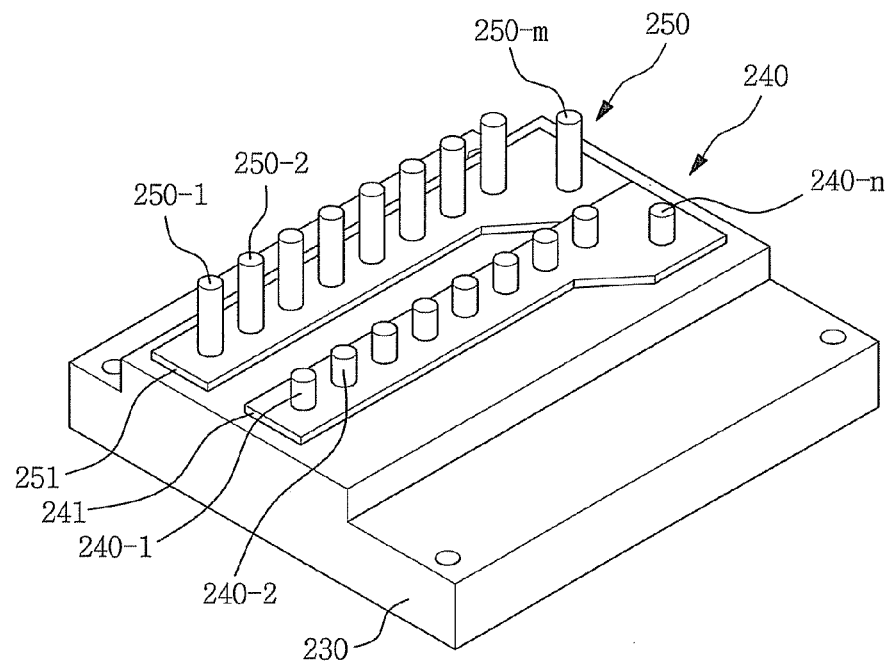
FIGS. 7A and 7B are perspective views of a socket structure according to example embodiments of the inventive concepts.
Figure 7B:
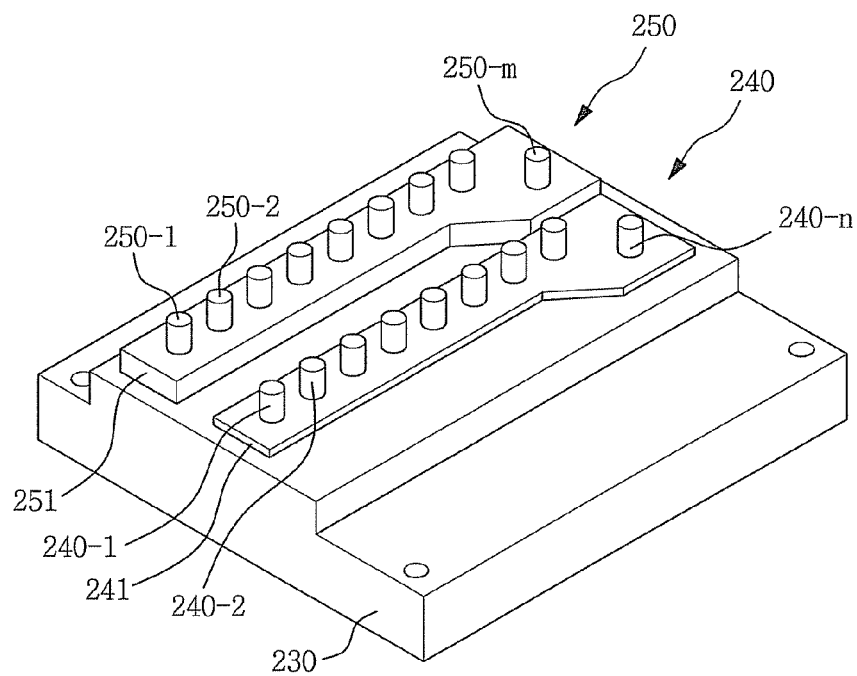

FIGS. 7A and 7B are enlarged perspective views of socket structures formed on one main socket support 230. As illustrated in FIGS. 7A and 7B, two sockets 240 and 250 are formed on the main socket support 230. The sockets 240 and 250 are formed to extend to different surface levels. The socket having a relatively low surface level is the lower socket 240, and the socket having a relatively high surface level is the upper socket 250. The lower socket 240 includes a plurality of lower socket pins 240-1 to 240-*n* and a lower support 241. The lower socket pins 240-1 to 240-*n* are fixed to the lower support 241. Similarly, the upper socket 250 includes a plurality of upper socket pins 250-1 to 250-*m* and an upper support 251. The upper socket pins 250-1 to 250-*m* are fixed to the upper support 251. The arrangement of the socket pins 240-1 to 240-*n* and 250-1 to 250-*m* is designed to correspond to that of the pads of the semiconductor packages that are stacked and received in the insert 180 or the pocket 190 in an offset or stepwise fashion. In detail, the pads 311 of the lower semiconductor package 310 received on the bottom of the insert 180 are electrically connected with the lower socket pins 240-1 to 240-*n*, while the pads 321 of the upper semiconductor package 320 received on the lower semiconductor package 310 are electrically connected with the upper socket pins 250-1 to 250-*m*.

FIGS. 7A and 7B illustrate an example embodiment of the inventive concepts in which the lower and upper sockets 240 and 250 have different surface levels. As illustrated in FIG. 7A, the lower support 241 has a thickness about equal to the upper support 251, and the lower sockets pins 240-1 to 240-*n* are different in length from the upper socket pins 250-1 to 250-*m*, so that the lower and upper sockets 240 and 250 have different surface levels. For example, the upper socket pins 250-1 to 250-*m* may be formed to be longer than the lower sockets 240-1 to 240-*n*. A length difference between the upper socket pins 250-1 to 250-*m* and the lower sockets 240-1 to 240-*n* is typically about equal to the thickness of the lower semiconductor package 310. However, as described below, when the latch having a presser is used to fix the position of the lower semiconductor package 310, the upper socket pins 250-1 to 250-*m* are formed to have the length corresponding to a value equal to a sum of the length of the lower sockets 240-1 to 240-*n*, the thickness of the lower semiconductor package 310, and a thickness of the presser of the latch.

In another example embodiment of the inventive concepts, as shown in FIG. 7B, the socket pins 240-1 to 240-*n* are equal in length to the socket pins 250-1 to 250-*m*, and the upper support 251 to which the upper socket pins 250-1 to 250-*m* are fixed is thicker than the lower support 241 to which the lower socket pins 240-1 to 240-*n* are fixed, so that the upper support 251 protrudes relative to the lower support 241. Thus, a surface level difference between the lower and upper sockets 240 and 250 is formed. The surface level difference, i.e. a thickness difference between the lower and upper supports 241 and 251, is typically equal to the thickness of the lower semiconductor package 310. When the position of the lower semiconductor package is fixed by the latch having the presser, the thickness of the presser may be taken into consideration.

Furthermore, according to another example embodiment of the inventive concepts, the main socket support 230 may include one or more sockets having three or more steps with surface level differences. In this case, one or more other semiconductor packages may be stacked in the insert 180 and the pocket 190 between the lower and upper semiconductor packages 310 and 320 in an offset fashion.

FIGS. 8A through 8D are plan views of two sockets 240 and 250 formed on the main socket support 230, and semiconductor packages 310 and 320 stacked in an offset fashion in the insert 180 and the pocket 190 electrically connected with the sockets 240 and 250, according to an example embodiment of the inventive concepts. The lower socket 240 includes the lower support 241 on which the lower socket pins 240-1 to 240-n are formed at an interval of a first pitch (P1), and the upper socket 250 includes the upper support 251 on which the upper socket pins 250-1 to 250-m are formed at an interval of a second pitch (P2). FIG. 8E is a plan view illustrating the state in which four sockets 240, 250, 260 and 265 are formed on the main socket support 230 and the semiconductor packages are electrically connected with the respective sockets. The semiconductor packages are indicated by dotted lines.

Figure 8A:
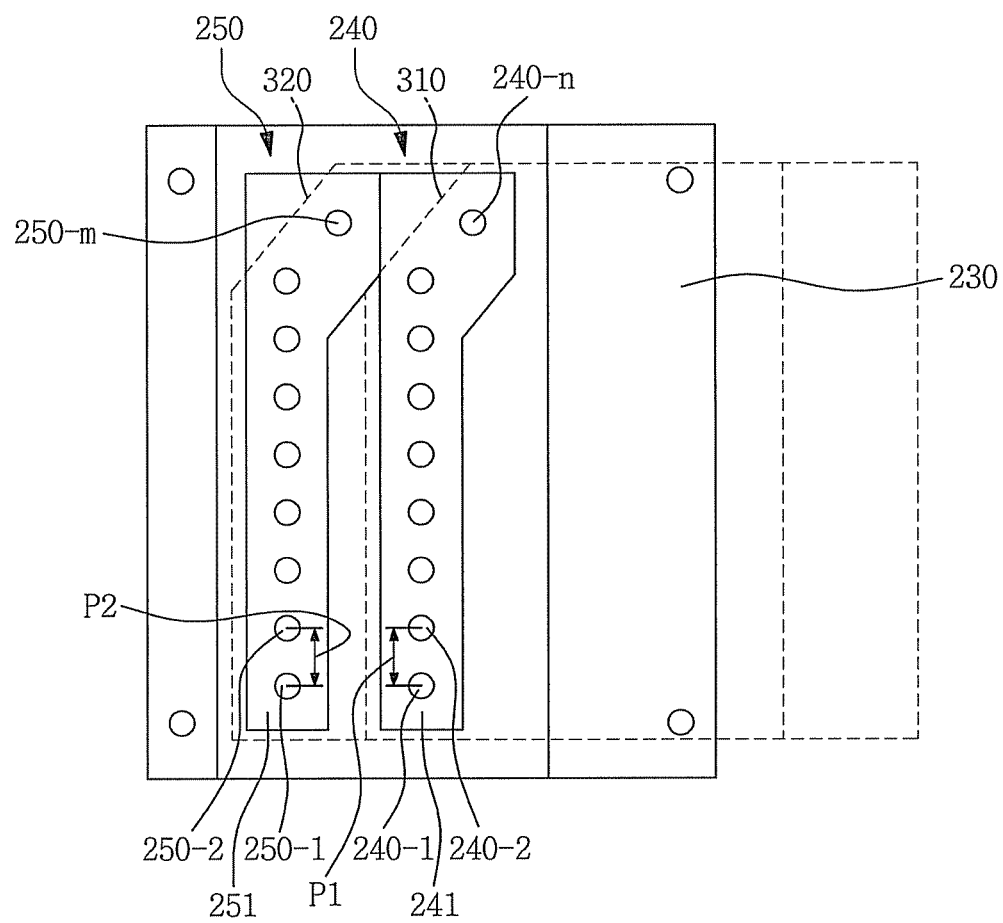
FIGS. 8A through 8E are plan views of a socket structure according to example embodiments of the inventive concepts.
Figure 8B:
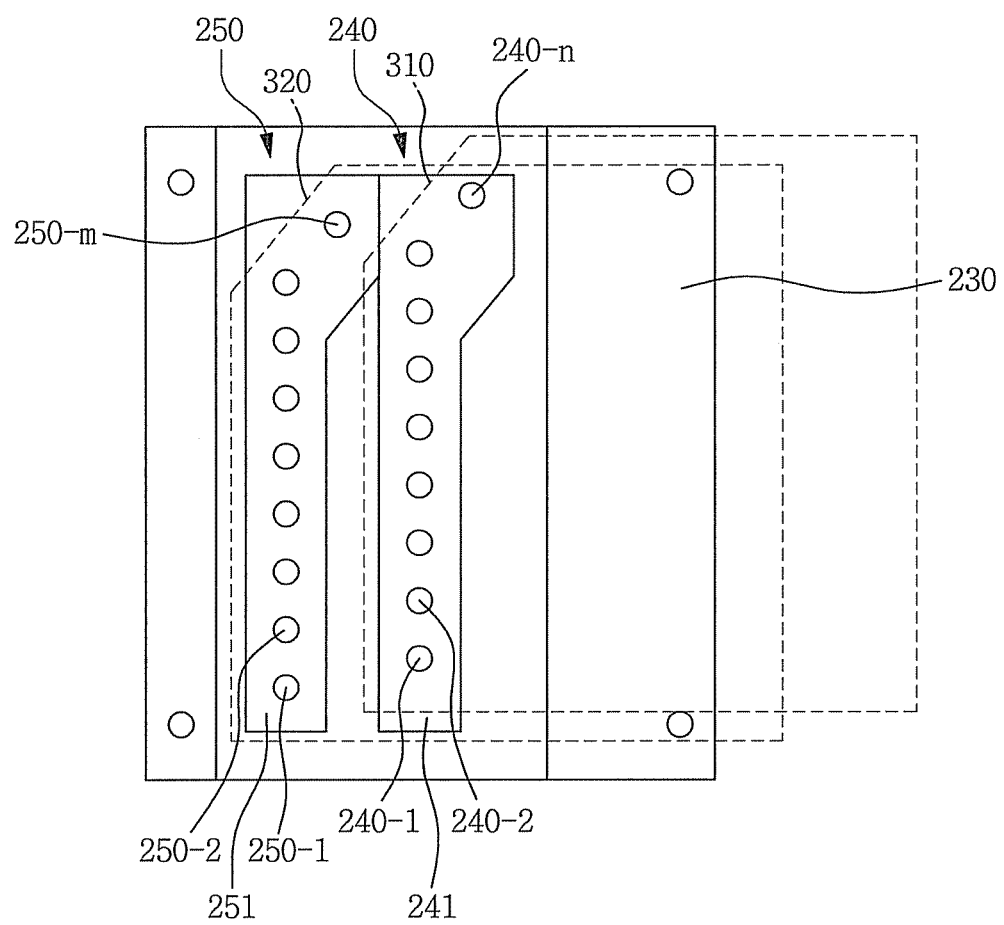

FIGS. 8A and 8B are plan views of the main socket support 230 according to an example embodiment of the inventive concepts, in which the semiconductor packages 310 and 320 to be tested have the same size. In detail, the lower socket pins 240-1 to 240-n are formed on the lower support 241 at an interval of a first pitch (P1), and the upper socket pins 250-1 to 250-m are formed on the upper support 251 at an interval of a second pitch (P2). Here, the first pitch interval (P1) is equal to the second pitch interval (P2); however, the inventive concepts are not limited hereto as the first pitch interval (P1) may be different from the second pitch interval (P2). The pads of the lower semiconductor package 310 are electrically connected with the lower socket pins 240-1 to 240-n, and the pads of the upper semiconductor package 320 are electrically connected with the upper socket pins 250-1 to 250-m. The pitch interval and the arrangement of the lower and upper socket pins 240-1 to 240-n and 250-1 to 250-m correspond to the pitch interval and the arrangement of the lower and upper semiconductor packages 310 and 320, respectively.

FIG. 8A shows the case in which the lower socket pins 240-1 to 240-n of the socket 240 and the upper socket pins 250-1 to 250-m of the socket 250 have the same pitch interval and arrangement. In this arrangement, a line connecting 240-1 and 240-2 selected from the lower socket pins is about perpendicular to a line connecting 240-1 with the upper socket pin 250-1 nearest the lower socket pin 240-1.

In order to minimize electromagnetic interference between the socket pins formed on each socket to minimize a test error and reduce a test time, a distance between the socket pins of the two adjacent sockets should be as far as possible. For example, according to another example embodiment of the inventive concepts, when one 250-6 of two central ones 250-5 and 250-6 of the upper socket pins 250-1 to 250-m (e.g. m=10) is selected at a distance nearest two central ones 240-5 to 240-6 of the lower socket pins 240-1 to 240-n (e.g. n=10), the socket pins may have an arrangement where distances between the selected upper socket pin 250-6 and the two adjacent lower socket pins 240-5 to 240-6 are equal to each other (i.e. where a distance between the upper socket pin 250-6 and the lower socket pin 240-5 is equal to that between the upper socket pin 250-6 and the lower socket pin 240-6). To this end, as illustrated in FIG. 8B, the lower socket pins 240-1 to 240-n and the upper socket pins 250-1 to 250-m are required to be arranged in a zigzag pattern. FIG. 8B shows an arrangement of the socket pins in which the lower socket pins 240-1 to 240-n are displaced upwards by a half of the pitch interval. Here, in the stacked structure of the semiconductor packages inserted into the insert (not shown), the upper semiconductor package 320 is stacked in an offset fashion where it is displaced upwards by a half of the pitch interval (P1) of the lower socket pins 240-1 to 240-n to correspond to the arrangement of the socket pins of the socket 230. In this case, the lower semiconductor package 310 is fixed using the latches, which will be described below. Alternatively, instead of the lower socket pins 240-1 to 240-n, the upper socket pins 250-1 to 250-m may be displaced upwards by a half of the pitch interval (P1) of the lower socket pins 240-1 to 240-n.

The number and arrangement of the socket pins may depend on the type and structure of the semiconductor packages stacked in the insert 180 or the socket 190 in an offset fashion.

Figure 8C:
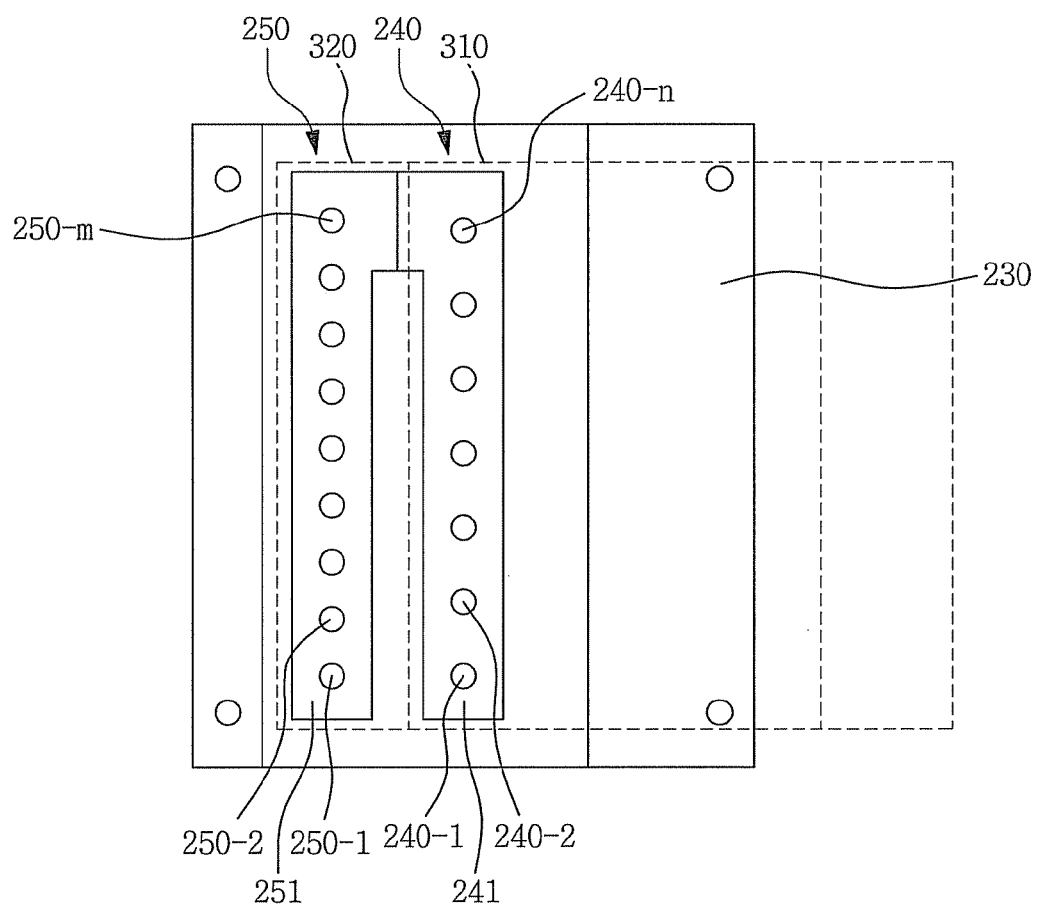

FIG. 8C illustrates a socket structure according to still another example embodiment of the inventive concepts. That is, a socket structure for testing semiconductor packages 310 and 320 that are different in the number of pads is illustrated. As illustrated in FIG. 8C, the lower semiconductor package 310 has seven pads, and the upper semiconductor package 320 has nine pads. Thus, the lower socket 240 has seven lower socket pins 240-1 to 240-7, and the upper socket 250 has nine upper socket pins 250-1 to 250-9. When the two semiconductor packages 310 and 320 are stacked in the insert (not shown) of the test tray 170 in an offset or stepwise fashion and transferred to the test chamber 130, the sockets 240 and 250 of the test head 200 which have the structure of FIG. 8C come into electrical contact with the lower and upper semiconductor packages 310 and 320. Thus, the sockets 240 and 250 can independently test these semiconductor packages that are different in the number of pads at the same time.

In FIG. 8C, the number of socket pins and the number of pads of the semiconductor package are merely illustrative. Furthermore, to minimize electromagnetic interference between the socket pins of each socket, the socket pins 240-1 to 240-n of the first socket and the socket pins 250-1 to 250-m of the second socket may be formed in a zigzag pattern, as described above.

Figure 8D:
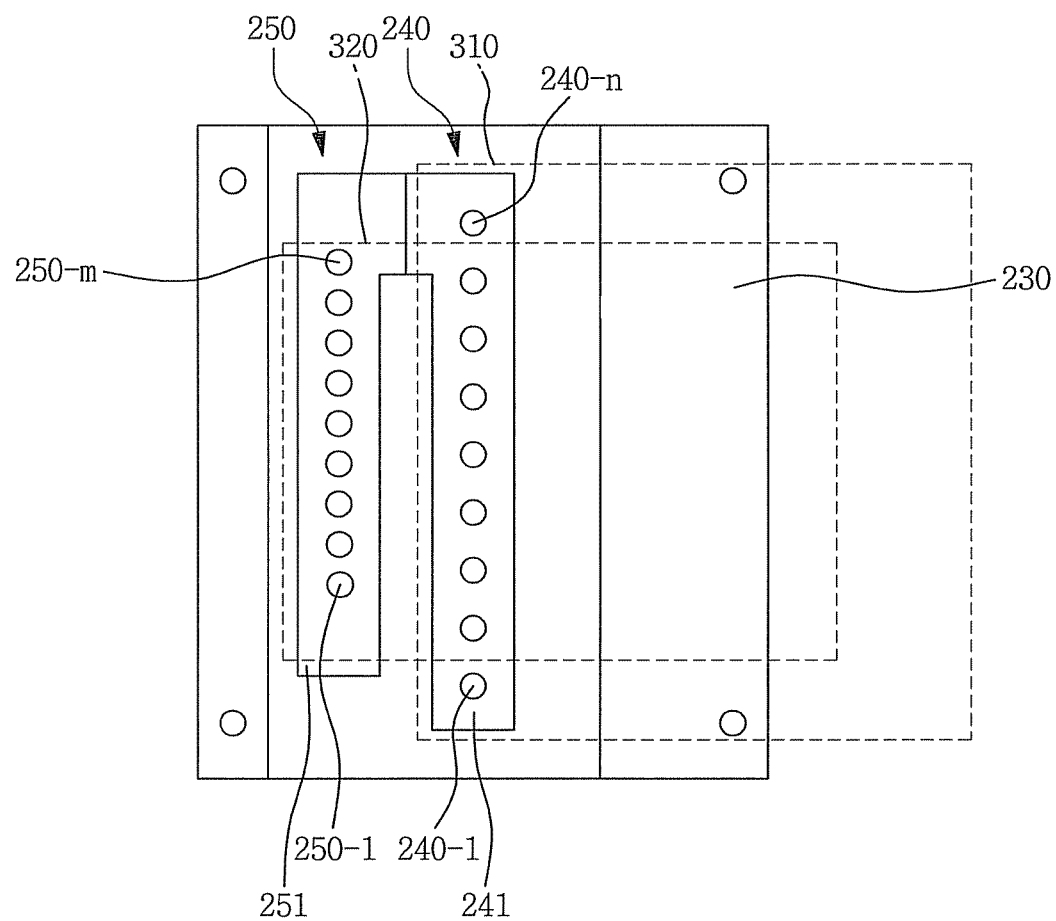
Figure 8E:
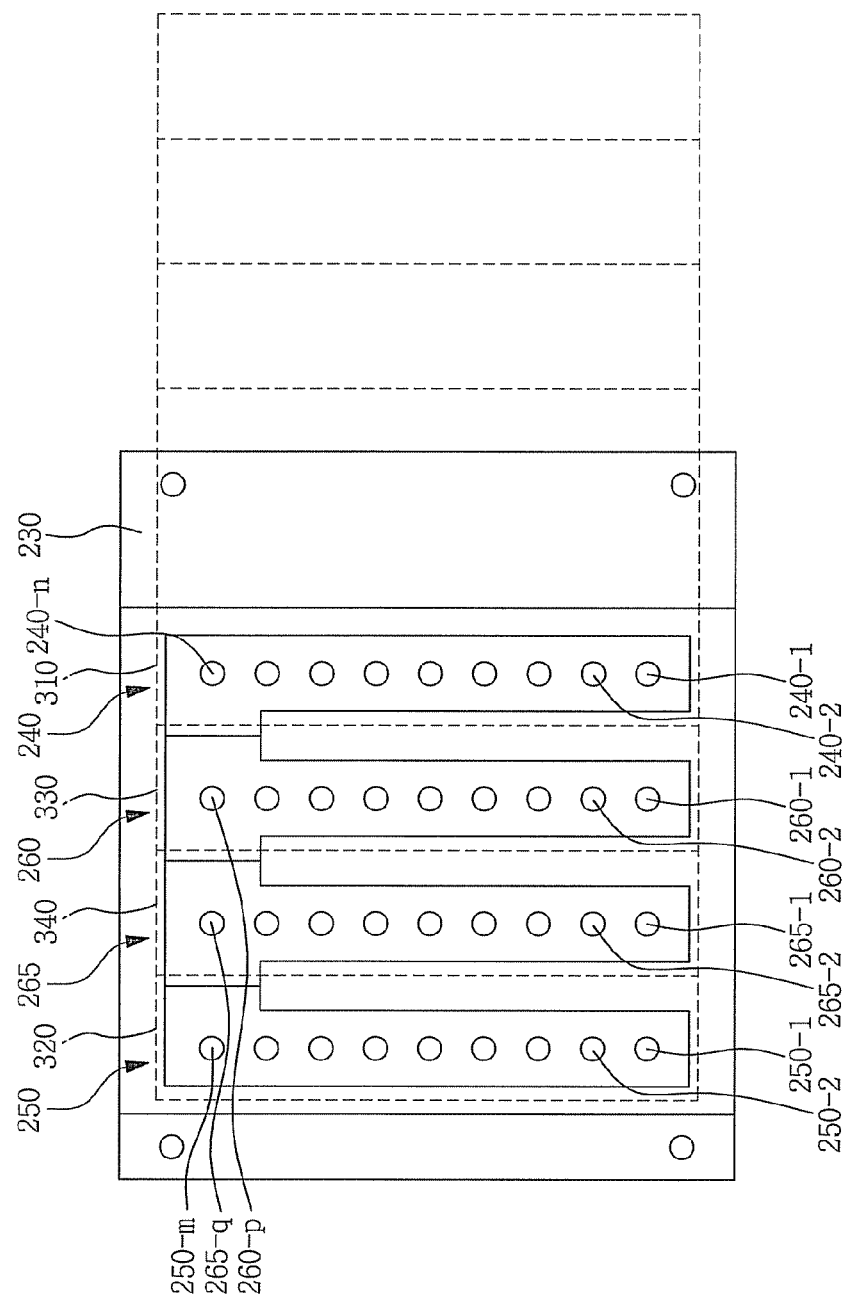

FIG. 8D illustrates a structure of the main socket support 230 according to yet another example embodiment of the inventive concepts. That is, a socket structure for testing semiconductor packages 310 and 320 having different sizes is illustrated. A width of the lower semiconductor package 310 is larger than that of the upper semiconductor package 320, and the arrangement and configuration of the socket pins 240-1 to 240-n and 250-1 and 250-m are formed so as to correspond to the widths of the semiconductor packages. In the case where the width of the lower semiconductor package 310 is larger than that of the upper semiconductor package 320, or vice versa, the configuration of the socket pins 240-1 to 240-n and 250-1 and 250-m may be modified so as to be electrically connected to the pads of the semiconductor packages.

Further, according to yet another example embodiment of the inventive concepts, the number of semiconductor packages which are inserted and stacked in one insert 180 in test tray 170 in a stepwise fashion is not limited to two, and thus may be three or more. In this case, the socket structure should have a step form where the socket pins are formed in three or more steps. FIG. 8E illustrates a socket structure capable of independently testing four semiconductor packages at the same time. For example, two or more other semiconductor packages may be stacked between the lower and upper semiconductor packages 310 and 320 in an offset fashion. In FIG. 8E, the lower semiconductor package 310 is inserted and received in the bottom of the insert (not shown) first, and then the third semiconductor package 330, the fourth semiconductor package 340, and the upper semiconductor package 320 are sequentially stacked and received in the insert, and these semiconductor packages are indicated by dotted lines. The lower socket pins 240-1 to 240-$n$ electrically connected with the pads (not shown) of the lower semiconductor package 310, third socket pins 260-1 to 260-$p$ electrically connected with the third semiconductor package 330, fourth socket pins 265-1 and 265-$q$ electrically connected with the fourth semiconductor package 340, and the upper socket pins 250-1 and 250-$m$ electrically connected with the upper semiconductor package 320 are formed on the respective sockets 240, 260, 265 and 250.

Figure 9A:
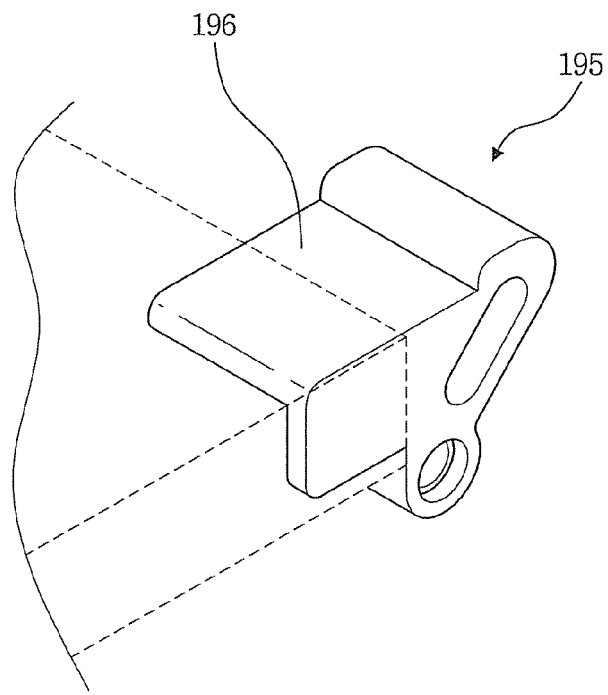
FIGS. 9A and 9B are perspective views of a latch according to example embodiments of the inventive concepts.
Figure 9B:
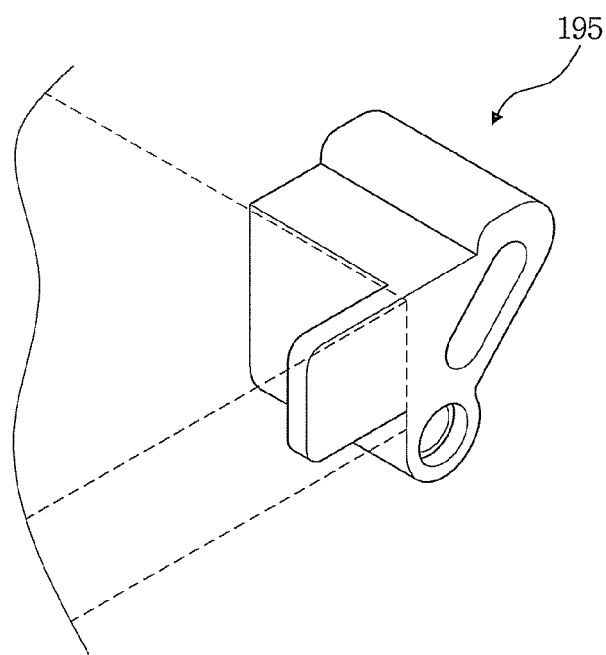

FIGS. 9A and 9B illustrate a latch 195 for fixing the uppermost semiconductor package according to an example embodiment of the inventive concepts. Dotted lines show a received semiconductor package. The lower and upper semiconductor packages 310 and 320 may be received between the latch 195 and the plate 194. The latch 195 illustrated in FIG. 9A has a presser 196 capable of fixing front and rear, left and right positions of the uppermost semiconductor package as well as pressing the uppermost semiconductor package in a downward direction. FIG. 9B illustrates a latch 195 for fixing the other semiconductor packages other than the uppermost semiconductor package. The latch 195 illustrated in FIG. 9B has no presser.

The latch 195 is not limited in its shape or operation as long as it can fix the position of the semiconductor package.

According to example embodiments of the inventive concepts, it is possible to increase the number of semiconductor packages inserted into one insert, and thus multiply the number of semiconductor packages to be simultaneously tested per unit time.

Further, it is possible to simultaneously test the semiconductor packages without reducing the number of semiconductor packages, and increase an area of the semiconductor package, so that it is possible to test the semiconductor packages having various areas.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed example embodiments, as well as other embodiments, are intended to be included within the scope of the appended claims.

What is claimed is:

1. A semiconductor package test apparatus, comprising:
    an insert configured to support a plurality of semiconductor packages in an offset fashion; and
    a plurality of sockets adjacent to the insert, each of the sockets having a plurality of socket pins, wherein the sockets are configured for alignment with the semiconductor packages and the sockets have different surface levels.

2. The semiconductor package test apparatus according to claim 1, wherein the insert includes a plate having at least one opening, a front guide on one end of the plate, and a rear guide facing the front guide, the plate and the rear guide is configured to restrain a lower semiconductor package of the plurality of semiconductor packages, and the front guide is configured to restrain an upper semiconductor package of the plurality of semiconductor packages, the upper semiconductor package is on the lower semiconductor package.

3. The semiconductor package test apparatus according to claim 2, wherein the rear guide is further configured to restrain the upper semiconductor package.

4. The semiconductor package test apparatus according to claim 2, wherein the lower and upper semiconductor packages are equal in size to each other.

5. The semiconductor package test apparatus according to claim 2, wherein the insert further includes latches configured to restrain the upper semiconductor package, and the latches are configured to sandwich the lower and upper semiconductor packages between the latches and the plate.

6. The semiconductor package test apparatus according to claim 2, wherein one or more of the semiconductor packages are between the lower and upper semiconductor packages in an offset fashion.

7. The semiconductor package test apparatus according to claim 1, wherein each of the semiconductor packages of the plurality of semiconductor packages include a plurality of pads and the pluralities of socket pins are configured to contact the pluralities of pads to electrically connect the plurality of sockets to the plurality of semiconductor packages.

8. The semiconductor package test apparatus according to claim 1, wherein
    the sockets include
        a lower socket configured to align with a lower semiconductor package of the plurality of semiconductor packages, the lower socket including a plurality of lower socket pins, and
        an upper socket configured to align with an upper semiconductor package of the plurality of semiconductor packages and having a plurality of upper socket pins, the plurality of upper socket pins having a surface level higher than that of the plurality of lower socket pins.

9. The semiconductor package test apparatus according to claim 8, wherein the plurality of upper socket pins are longer than the plurality of lower socket pins.

10. The semiconductor package test apparatus according to claim 8, wherein the lower socket includes a lower support supporting the plurality of lower socket pins, and the plurality of upper socket includes an upper support supporting the plurality of upper socket pins, and the upper support protrudes relative to the lower support.

11. The semiconductor package test apparatus according to claim 8, further comprising:
    a signal input/output unit adjacent to the sockets, wherein the pluralities of lower and upper socket pins are connected to the signal input/output unit.

12. The semiconductor package test apparatus according to claim 11, wherein the plurality of lower socket pins are electrically isolated from the plurality of upper socket pins.

13. The semiconductor package test apparatus according to claim 8, wherein the lower socket includes a lower support in which the plurality of lower socket pins are arranged at an interval of a first pitch, and the upper socket includes an upper support in which the plurality of upper socket pins are arranged at an interval of a second pitch; and the lower and upper socket pins have one selected from the group consisting of an arrangement in which the first pitch is equal to the second pitch, and a line connecting two central lower socket pins selected from the plurality of lower socket pins is perpendicular to a line connecting one central lower socket pin of the two central lower socket pins with an upper socket pin nearest the one central lower socket pin, an arrangement in which the first pitch is equal to the second pitch, and when one of two central upper socket pins of the upper socket pins is selected at a distance nearest two central lower socket pins of the plurality of lower socket pins, distances between the selected upper socket pin and the two adjacent lower socket pins are equal to each other, and an arrangement in which the first pitch is different from the second pitch, and a combination thereof.

14. A semiconductor test handler comprising:

a test tray configured to support a plurality of inserts; and a loader adjacent to the test tray, wherein each insert is configured to support a plurality of semiconductor packages stacked therein in an offset fashion.

15. The semiconductor test handler according to claim 14, wherein each insert includes a plate having at least one opening, a front guide on one end of the plate, and a rear guide facing the front guide, wherein the plate and the rear guide are configured to restrain a lower semiconductor package of the plurality of semiconductor packages, and the front guide is configured to restrain an upper semiconductor package of the plurality of semiconductor packages, the upper semiconductor package being on the lower semiconductor package.

16. The semiconductor test handler according to claim 15, wherein the rear guide is further configured to restrain the upper semiconductor package.

17. The semiconductor test handler according to claim 15, wherein each insert further includes latches configured to restrain the upper semiconductor package, and the lower and upper semiconductor packages are sandwiched between the latches and the plate.

18. A semiconductor package test apparatus, comprising:

an insert configured to support a first semiconductor package and a second semiconductor package, the insert configured to support the second semiconductor package and the first semiconductor package such that at least a portion of the second semiconductor is exposed by the first semiconductor package;

a first socket including a first plurality of socket pins configured to contact the first semiconductor package, the first plurality of socket pins including first ends at a first surface level; and a second socket including a second plurality of socket pins configured to contact the second semiconductor package, the second plurality of socket pins including second ends at a second surface level which is different from the first surface level.

19. The semiconductor package test apparatus according to claim 18, wherein the insert includes a plate having at least one opening, a front guide on one end of the plate, and a rear guide facing the front guide, the plate and the rear guide is configured to restrain the first semiconductor package, the front guide being configured to restrain the second semiconductor package, and the first and second sockets are aligned in the at least one opening.

20. The semiconductor package test apparatus according to claim 18, wherein the first plurality of socket pins are configured to contact a first plurality of pads on the first semiconductor package and the second plurality of socket pins are configured to contact a second plurality of pads on the second semiconductor package.

* * * * *